United States Patent

Yokozawa

[11] Patent Number: 5,886,905
[45] Date of Patent: Mar. 23, 1999

[54] METHOD OF DETERMINING OPERATING CONDITIONS FOR A NONVOLATILE SEMICONDUCTOR MEMORY

[75] Inventor: Ayumi Yokozawa, Tokyo, Japan

[73] Assignee: NEC Corporation, Tokyo, Japan

[21] Appl. No.: 753,786

[22] Filed: Dec. 2, 1996

[30] Foreign Application Priority Data

Nov. 30, 1995 [JP] Japan ................................. 7-312403

[51] Int. Cl.$^6$ .................................................. G06F 17/50
[52] U.S. Cl. .......................................... 364/578; 364/488
[58] Field of Search ............................. 395/500; 364/488, 364/578

[56] References Cited

U.S. PATENT DOCUMENTS

| 4,635,218 | 1/1987 | Widdoes, Jr. ........................... 364/578 |
| 4,862,347 | 8/1989 | Rudy ....................................... 395/500 |
| 5,003,507 | 3/1991 | Johnson .................................. 395/500 |
| 5,146,460 | 9/1992 | Ackerman et al. ..................... 364/488 |
| 5,258,932 | 11/1993 | Matsuzaki et al. ..................... 364/578 |
| 5,371,748 | 12/1994 | Saw et al. ................................. 371/27 |
| 5,434,868 | 7/1995 | Aichelmann, Jr. et al. ........... 371/10.1 |

FOREIGN PATENT DOCUMENTS 3195060  8/1991  Japan .

*Primary Examiner*—Vincent N. Trans
*Attorney, Agent, or Firm*—Whitham, Curtis & Whitham

[57] ABSTRACT

On determining operating conditions for a nonvolatile semiconductor memory including a MOSFET (Metal Oxide Semiconductor Field-Effect Transistor), measurement is made, before completion of manufacture of the nonvolatile semiconductor memory and after completion of manufacture of the MOSFET, of characteristics of the MOSFET to obtain parameters which are used in simulating an operation of the nonvolatile semiconductor memory. By using the parameters, simulation of the operation of the nonvolatile semiconductor memory is executed to obtain a simulation result which is preferably a result relating to deterioration of operation characteristics of the nonvolatile semiconductor memory. The operating conditions for the nonvolatile semiconductor memory are obtained from the simulation result. The nonvolatile semiconductor memory may be an EEPROM (Electrically Erasable Programmable Read-Only Memory).

13 Claims, 10 Drawing Sheets

METHOD OF DETERMINING OPERATING CONDITIONS FOR A NONVOLATILE SEMICONDUCTOR MEMORY

BACKGROUND OF THE INVENTION

This invention relates to a nonvolatile semiconductor memory, typically an EEPROM (Electrically Erasable Programmable Read-Only Memory), including a MOSFET (Metal Oxide Semiconductor Field-Effect Transistor) and, in particular, to a method of predicting the life of a nonvolatile semiconductor memory as a predicted life and determining operating conditions for the nonvolatile semiconductor memory so that the predicted life achieves an objective value.

From a practical standpoint, it is required in manufacture of VLSI (very-large-scale integrated) circuits that manufactured products can perform their functions throughout their intended useful life, in other words, that the manufactured products are excellent in reliability. In order to achieve an excellent reliability of the products, attempts have been primarily made to improve a manufacturing process. In addition, it is important for a manufacturer to better predict the reliability of his products. In particular, when the reliability is deteriorated due to a particular type of reliability failure mechanism, it is critical for the manufacturer to detect the reliability failure mechanism.

It is believed that the deterioration in reliability of an EEPROM results from two major reliability failure mechanisms. The first mechanism is responsible for early reliability failures and involves submicroscopic defects present in a gate dielectric film (may be referred to as either a tunnel film or a tunnel dielectric film) of the EEPROM. The second mechanism is responsible for extensive reliability failures and involves defects or damages produced in the tunnel film after operation of the EEPROM. A so-called device life depends upon the second mechanism. As will later be described in detail, electrons pass through the tunnel film during operation of the EEPROM. The passage of the electrons causes the defects or the damages to occur in the tunnel film. The presence of the defects or the damages in the tunnel film will result in fluctuation of threshold levels of the EEPROM. Under the circumstances, it is a strong demand in view of the reliability of the tunnel film to predict in a factory stage post-operation characteristics of the EEPROM after operation and to assure the reliability of the products.

In the past, once a product had been completely manufactured, no way existed of predicting the life of the product. It has been a general practice to use screening procedures in which actual products are repeatedly tested to eliminate those products judged as failed products. However, the screening procedures are disadvantageous in that all the products are equally deteriorated through screening tests and that the life of good products surviving the screening tests is not known at all. In order to solve the above-mentioned problems, a proposal is made of a method of predicting a product life and is disclosed in Japanese Unexamined Patent Publication No. 195060/1991. In this method, measurement is made of the erase speed of ICs. The percentage of erased bits is plotted as a function of the applied gate threshold voltage. The percentage of bits located in an erase tail region of distribution is then identified. The bits located in the erase tail region are erased at a relatively high speed as compared with the remaining bits in an array. If the number of bits in the erase tail region exceeds a certain percentage of the total bits in the array, the IC is classified as one which is likely to suffer early endurance failure. Specifically, in the above-mentioned Japanese Unexamined Patent Publication No. 195060/1991, if the number of bits in the erase tail region of a device exceeds approximately 6% of the total bits in the array, the device is downgraded as less reliable. According to this method, it is possible to relatively easily and quickly carry out the screening tests as compared with known methods and to prevent deterioration through the screening tests.

In the above-mentioned conventional technique, however, the screening tests rely upon the early failures. In other words, the screening tests are to eliminate failed products very rapidly deteriorated. This technique is insufficient with respect to prediction of the life and the reliability of "good products" surviving the screening tests.

Furthermore, the prediction of the life in the above-mentioned technique can not be carried out until the device is completely manufactured. If the life then predicted does not reach the intended life, all products having been completely manufactured can not be shipped or delivered. Such problem will be avoided if the prediction of the life is carried out in an early stage of a manufacturing process of EEPROMs.

SUMMARY OF THE INVENTION

It is an object of this invention to provide a method of predicting deterioration of a nonvolatile semiconductor memory which has passed a screening test based on early failures.

It is another object of this invention to provide a method of predicting the life and other characteristics of a nonvolatile semiconductor memory in an early stage of a manufacturing process.

Other objects of this invention will become clear as the description proceeds.

According to this invention, there is provided a method of determining operating conditions for a nonvolatile semiconductor memory including a MOSFET (Metal Oxide Semiconductor Field-Effect Transistor), comprising: a first step of simulating an operation of the nonvolatile semiconductor memory before completion of manufacture of the nonvolatile semiconductor memory to obtain a simulation result; and a second step of obtaining the operating conditions for the nonvolatile semiconductor memory from the simulation result.

Typically, the first step is for simulating the operation of the nonvolatile semiconductor memory before completion of manufacture of the nonvolatile semiconductor memory and after completion of manufacture of the MOSFET to obtain the simulation result.

In this event, the first step may comprise: a step of obtaining, from measurement of characteristics of the MOSFET, parameters used in simulating the operation of the nonvolatile semiconductor memory before completion of manufacture of the nonvolatile semiconductor memory and after completion of manufacture of the MOSFET; and a simulation executing step of executing simulation of the operation of the nonvolatile semiconductor memory by using the parameters to obtain the simulation result.

More specifically, the simulation executing step is for executing the simulation of the operation of the nonvolatile semiconductor memory by using the parameters to obtain, as the simulation result, a result relating to deterioration of operation characteristics of the nonvolatile semiconductor memory. In this case, the second step is for obtaining the operating conditions for the nonvolatile semiconductor memory from the result relating to the deterioration of the operation characteristics of the nonvolatile semiconductor memory.

The nonvolatile semiconductor memory may be an EEPROM (Electrically Erasable Programmable Read-Only Memory).

DESCRIPTION OF THE PREFERRED EMBODIMENT

Figure 1:
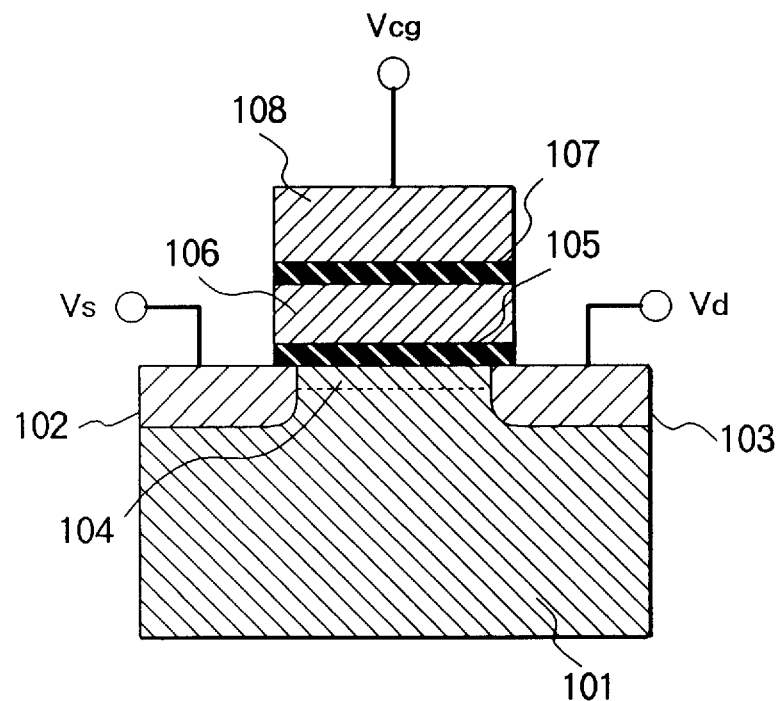
FIG. 1 is a sectional view of a typical EEPROM.

In order to facilitate an understanding of this invention, description will be made as regards a principle of operation of an EEPROM with reference to FIG. 1. The EEPROM includes source and drain regions 102 and 103 formed in a p-type silicon substrate 101. The separation between the source and the drain regions 102 and 103 defines a channel region 104 over which a tunnel dielectric film (tunnel oxide film) 105 is grown. A floating gate 106 is formed on the tunnel dielectric film 105. Above the floating gate 106, a control gate 108 is formed. Both of the floating and the control gates 106 and 108 are usually formed of polycrystalline silicon (i.e., polysilicon). The control gate 108 is insulated from the floating gate 106 by an insulation film 107. The insulation film 107 normally comprises silicon dioxide, silicon nitride, or a nitride oxide composite.

When the control gate 108 is applied with a voltage Vcg, cycling operations are performed to accumulate electrons in the floating gate 106 through the tunnel dielectric film 105 on one hand and to remove the electrons from the floating gate 106 on the other hand. Generally, the operation of accumulating the electrons in the floating gate 106 is called "programming" while the operation of removing the electrons from the floating gate 106 is called "erasing". Herein, the voltage applied to the control gate 108 to turn on a transistor formed below the floating gate 106 is equal to first and second threshold levels $Vth_1$ and $Vth_2$ in presence and absence of electrons in the floating gate 106, respectively. In this event, the first threshold level $Vth_1$ must be greater than the second threshold level $Vth_2$. In the EEPROM, the first and the second threshold levels $Vth_1$ and $Vth_2$ correspond to signals having signal levels "1" and "0".

The EEPROM in FIG. 1 can be erased by the Fowler-Nordheim tunneling effect (hereinafter referred to as the FN tunneling effect) of the electrons from the floating gate 106 to the source or the channel region 102 or 104. In certain types of EEPROMs, the FN tunneling effect of the electrons can be utilized during programming. In the EEPROM, by carrying out at least one of the programming and the erasing operations, the electrons pass through the tunnel dielectric (tunnel oxide) film by the tunneling effect. The passage of the electrons causes defects to occur in the tunnel dielectric (tunnel oxide) film. These defects act as trap levels for trapping the electrons and positive holes. This results in fluctuation of the threshold levels of the EEPROM. In addition, these defects deteriorate dielectric endurance of the tunnel film to bring about loss of the electrons accumulated in the floating gate by a so-called "leakage". As a result, the EEPROM can not normally operate.

Now, description will proceed to this invention with reference to the drawing.

According to this invention, the life of an EEPROM is predicted by simulating the operation of the EEPROM using, as input parameters, characteristics of a MOSFET which is a component of the EEPROM illustrated in FIG. 1. By the use of the result of simulation, it is also possible to determine optimum operating conditions for the EEPROM such that an intended life is achieved. Advantageously, the prediction of the life and the determination of the optimum operating conditions can be carried out at a stage where the MOSFET has been manufactured during a manufacturing process of the EEPROM. Once the life of the EEPROM is predicted, the optimum operating conditions for the EEPROM can be determined so as to assure the intended life. Thus, it is possible to provide the EEPROM which is reliable.

Figure 2:
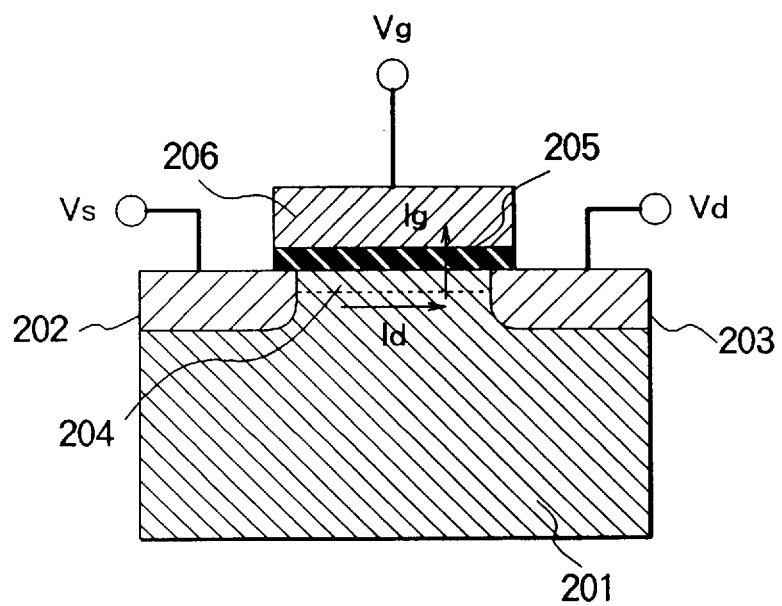
FIG. 2 is a sectional view of a MOSFET as a part of the EEPROM.

In order to obtain the input parameters for use in simulating the operation of the EEPROM illustrated in FIG. 1, measurement is at first made of the characteristics of the MOSFET illustrated in FIG. 2 which is one of the components of the EEPROM. The MOSFET used in the measurement may be experimentally prepared through a process equivalent to the manufacturing process of the EEPROM in consideration or may be a part of the EEPROM actually manufactured. Alternatively, the input parameters can be obtained from measurement of characteristics of a MOS capacitor manufactured under a manufacturing condition equivalent to that of the MOSFET of the EEPROM. Hereinafter, the MOSFET and the MOS capacitor are collectively called a MOS device. A tunnel film of the EEPROM may be not only a pure oxide film but also a film containing a considerable amount of other element such as nitrogen. Herein, the MOS devices include metal/dielectric film/semiconductor structures having such films. The characteristics of the MOS devices to be measured include the following characteristics. Referring to FIGS. 2 through 6, these characteristics will be described.

Referring to FIG. 2, the MOSFET includes source and drain regions 202 and 203 formed in a p-type silicon substrate 201. The separation between the source and the drain regions 202 and 203 defines a channel region 204 over which a gate dielectric film 205 is grown. A gate electrode 206 is formed on the gate dielectric film 205. The gate electrode 206 is applied with a gate voltage (Vg). The gate voltage (Vg) may be understood as a voltage applied between the gate electrode 206 and the silicon substrate 201, the source region 202, or the drain region 203. A gate current (Ig) flows through the gate dielectric film 205, namely, between the gate electrode 206 and the silicon substrate 201, the source region 202, or the drain region 203. A drain voltage (Vd) and a source voltage (Vs) are applied on the drain region 203 and the source region 202, respectively. A drain current (Id) flows from the source region 202 to the drain region 203 through the channel region 204. By the use of the MOSFET, the following characteristics are measured.

(1) Gate Voltage (Vg) versus Time (t) Characteristic on C(Vg-t t-Current Stress Condition (Vg-t characteristic)

Figure 3:
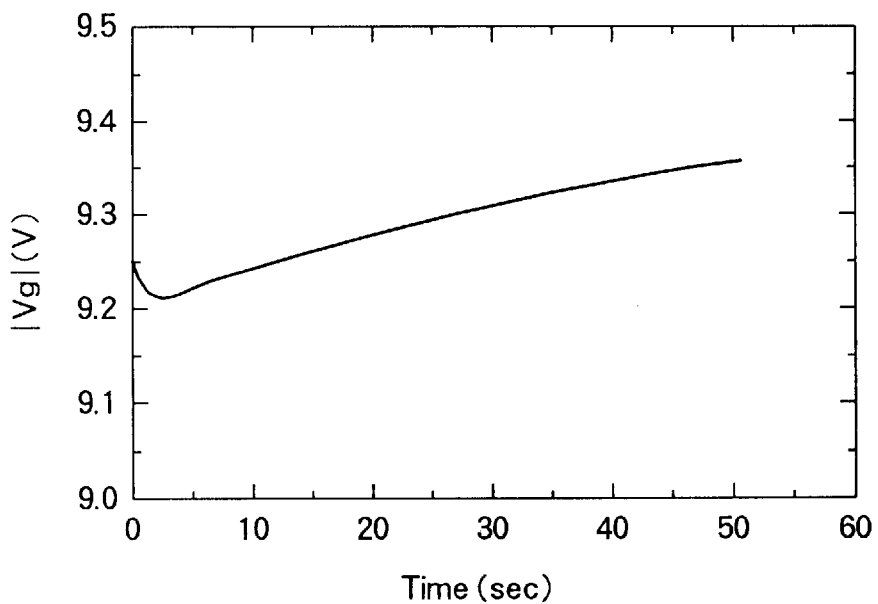
FIG. 3 shows a time-dependent characteristic of a gate voltage required to flow a constant current through a tunnel film in a MOS device.

Measurement is made of variation of the gate voltage (Vg) with lapse of time in a condition where the gate current (Ig) has a constant level (hereinafter referred to as a constant current level). The typical Vg-t characteristic obtained by the measurement is shown in FIG. 3. Referring to FIG. 3, the gate voltage (Vg) is reduced in a range where the time (t) is small, as compared with the time equal to zero (t=0). This is because positive charges are trapped in the oxide film (the gate dielectric film 205) of the MOS device. On the contrary, the gate voltage (Vg) is increased with the increase of the time (t). This is because negative charges are trapped in the oxide film (the gate dielectric film 205) of the MOS device. From this measurement, the amount of the charges trapped in the film is obtained.

(2) Gate Current (Ig) versus Time (t) Characteristic on Constant-Voltage Stress Condition (Ig-t Characteristic).

Measurement is made of variation of the gate current (Ig) with lapse of time in a condition where the gate voltage (Vg) has a constant level (hereinafter referred to as a constant voltage level). From this measurement, the amount of the charges present in the film is obtained. The charges present in the film may simply be called film charges for convenience of description.

(3) Capacitance (C) versus Gate Voltage (Vg) Characteristic (C-Vg Characteristic)

Figure 4:
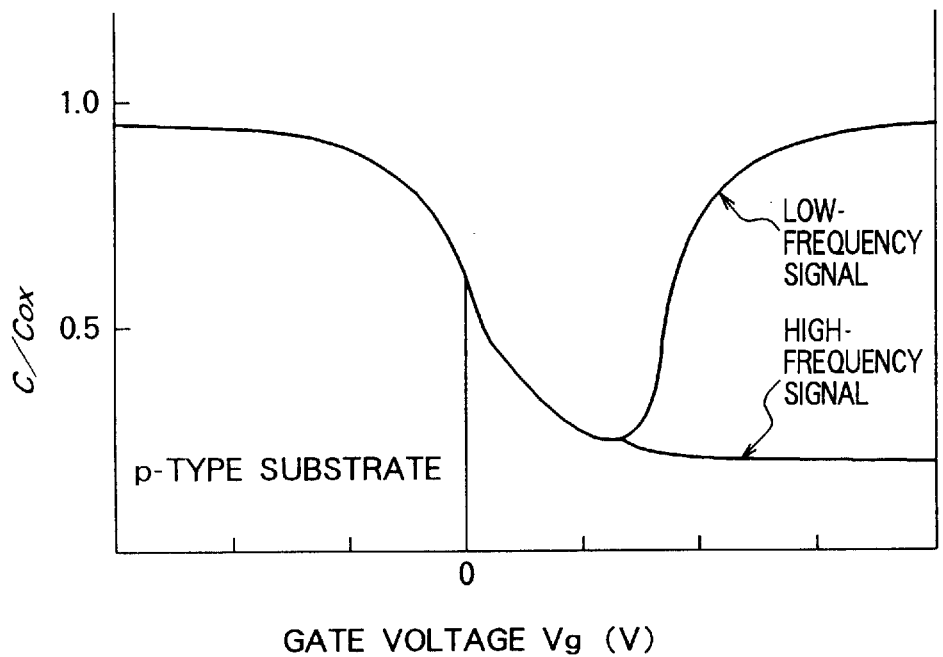
FIG. 4 shows a MOS capacitance versus gate voltage characteristic in the MOS device.

Measurement is made of variation of a capacitance (C) of the MOSFET with variation of the gate voltage (Vg). The typical C-Vg characteristic is shown in FIG. 4. As seen from FIG. 4, low-frequency C-Vg and high-frequency C-Vg characteristics appear in dependence upon the frequency of the gate voltage (Vg). The variation of the capacitance (C) obtained in this measurement exhibits the behavior of an inversion layer of a semiconductor in absence of deterioration of the gate dielectric film. On the other hand, in presence of interfacial (or electrokinetic) levels or the trapped charges in the film, the variation of the capacitance (C) gives the nature and the amount of the interfacial levels or the trapped charges in the film.

(4) Gate Current (Ig) versus Gate Voltage (Vg) Characteristic (Ig-Vg Characteristic)

Figure 5:
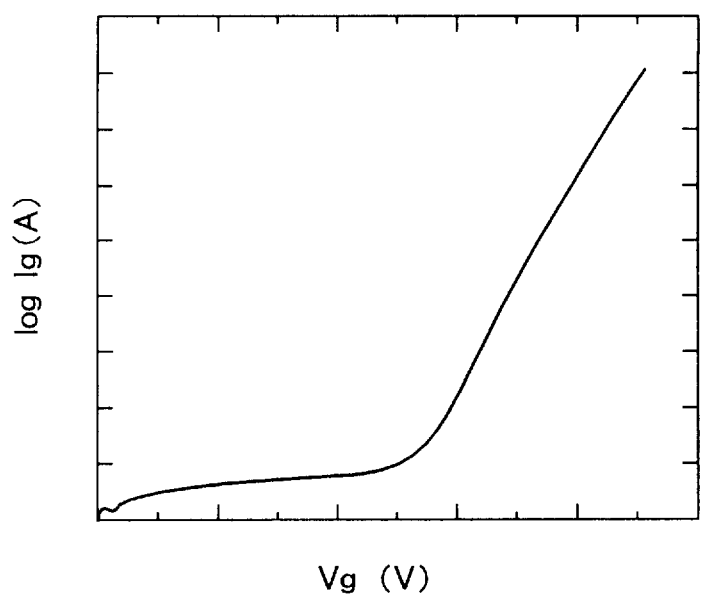
FIG. 5 shows a gate current versus gate voltage characteristic in the MOS device.

Measurement is made of variation of the gate current (Ig) with variation of the gate voltage (Vg). The typical Ig-Vg characteristic is shown in FIG. 5. In the figure, the gate current (Ig) has a high level in a range where the gate voltage (Vg) is high. Such a gate current (Vg) of a high level is produced by the FN tunneling effect and may be referred to as an FN current.

In case where the MOSFET is used, measurement may also be made of the following characteristics.

(5) Drain Current (Id) versus Drain Voltage (Vd) Characteristic (Id-Vd Characteristic)

Measurement is made of variation of the drain current (Id) with variation of the drain voltage (Vd) in a condition where the gate voltage (Vg) in the MOSFET has a certain preselected level. Similar measurement is carried out for different preselected levels of the gate voltage (Vg).

(6) Drain Current (Id) versus Gate Voltage (Vg) Characteristic (Id-Vg Characteristic)

Figure 6:
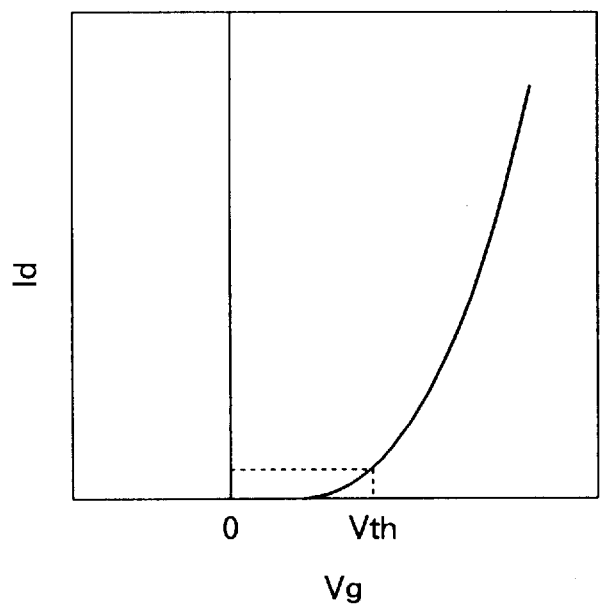
FIG. 6 shows a drain current versus gate voltage characteristic in the MOSFET.

Measurement is made of variation of the drain current (Id) with variation of the gate voltage (Vg) in a condition where the drain voltage (Vd) in the MOSFET has a certain preselected level. The typical Id-Vg characteristic is shown in FIG. 6. Generally, a threshold voltage (Vth) is defined as a particular level of the gate voltage (Vg) at which the drain current (Id) drastically increases to a level equal to or more than a required level. Similar measurement is carried out for different preselected levels of the drain voltage (Vd).

As for the above-mentioned characteristics (3) through (6), measurement is carried out before and after the application of electric stress. Herein, the application of the electric stress involves all operations to flow electric current through the oxide film (to inject electrons or positive holes into the oxide film), for example, by applying electric voltage to the gate electrode. In the simulation according to this invention, use is made of at least one of the above-mentioned characteristics as the results of measurement and various amounts extracted therefrom.

Figure 7:
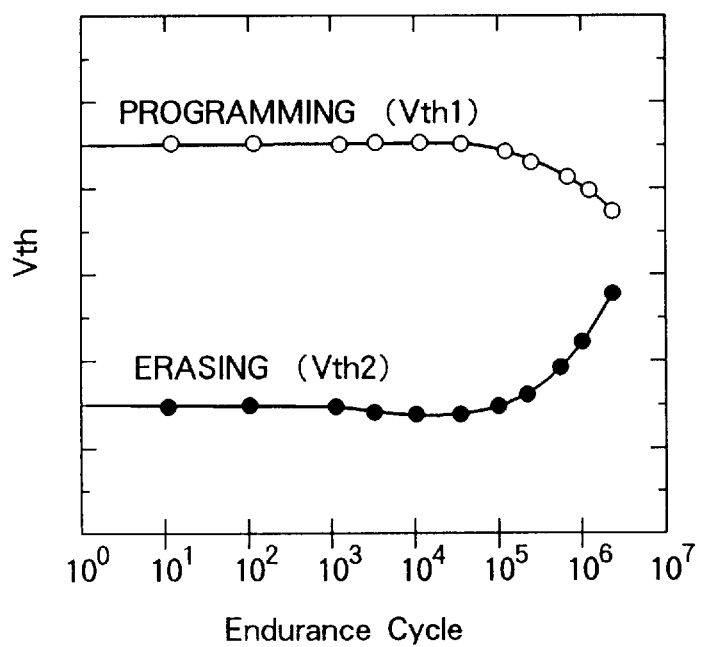
FIG. 7 shows an endurance cycle characteristic of the EEPROM.
Figure 8:
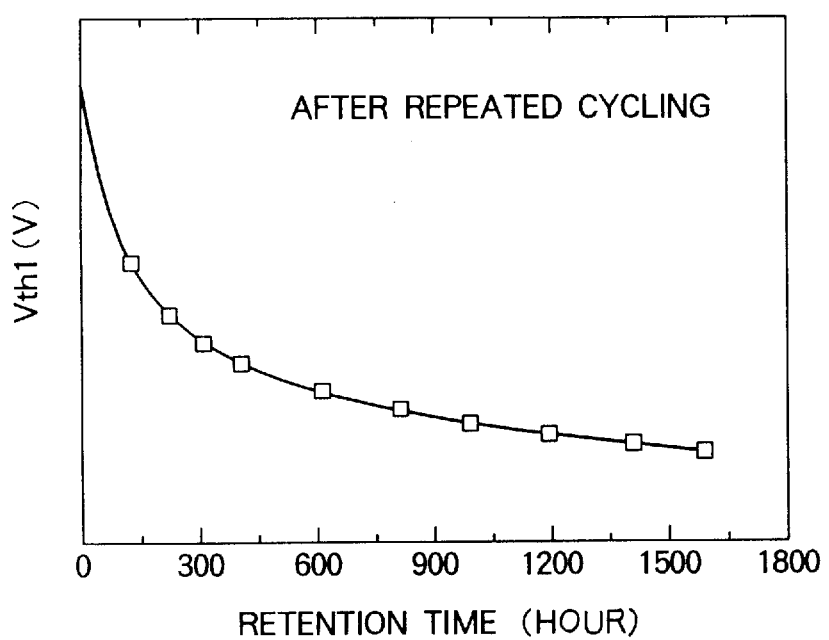
FIG. 8 shows a retention characteristic of the EEPROM.

Now, description will be made as regards the reliability of the EEPROM. Several characteristics can be used in evaluation of the reliability. Generally, the reliability failure is observed as a decrease of the threshold voltage in the programming operation, an increase of the threshold voltage in the erasing operation, or reduction in difference between the two threshold voltages resulting from at least one of the above-mentioned changes in the threshold voltages. The life of the EEPROM is understood to be a time instant when such reliability failure is so developed as to inhibit normal operation of the EEPROM. In evaluation of the reliability from the above-mentioned standpoint, use is widely made of two characteristics including an endurance cycle characteristic and a retention characteristic. Specifically, the endurance cycle characteristic is to observe variation of the threshold voltage Vth for each of the programming and the erasing operations with an increase in cycle times of these operations. The retention characteristic is to observe variation of the threshold voltage Vth with an increase of a holding time (hereinafter referred to as a retention time) in case where the EEPROM is left unoperated for a long time in a programming condition. The typical endurance cycle characteristic and the typical retention characteristic are shown in FIGS. 7 and 8, respectively. As seen from FIG. 7 where the abscissa is logarithmically scaled, the difference between the threshold voltages $Vth_1$ and $Vth_2$ in the programming operation and the erasing operation, respectively, is reduced with the increase of the cycle times. This phenomenon is called window-narrowing. Generally, evaluation of the reliability relies upon whether or not the difference between the threshold voltages satisfies an intended value at the cycle times of 1,000,000. As seen from FIG. 8, the threshold voltage in the programming condition is decreased with the increase of the retention time in the EEPROM experiencing 100,000 times of cycling of the programming and the erasing operations. Generally, evaluation of the reliability relies upon whether or not the variation of the threshold voltage at the retention time of about 1000 hours is equal to or smaller than the intended value. Hereinafter, evaluation of the reliability is carried out for the above-mentioned two characteristics as far as no special mentioning is made.

Now, description will be made as regards procedures of predicting the reliability and determining the operating conditions according to this invention. By way of example, description is directed to the EEPROM utilizing the FN tunneling effect in the programming and the erasing operations. Such operations may be referred to as FN programming and FN erasing operations. In the following, a number of specific details such as types of devices and voltages are mentioned. However, it will be understood that this invention can be put into practice without such specific details.

EXAMPLE 1

In conjunction with the EEPROM of the type mentioned above, description will be made as regards simulation of the operation of the EEPROM and simulation of the endurance cycle characteristic for evaluation of the reliability. In addition, description will also be made of prediction of the life and determination of optimum operating conditions to achieve the intended life with reference to the results of simulation.

At first, the simulation of the operation of the EEPROM will be described. In a flash memory having a structure as illustrated in FIG. 1, the threshold voltage Vth is calculated from the following equation:

$$V{th} = V{th}_0 - Qfg/Ccg, \quad (1)$$

where $V{th}_0$ represents a threshold value in absence of charges in the floating gate, Qfg, the amount of charges accumulated in the floating gate, and Ccg, the capacitance of the tunnel film between the floating gate and the control gate.

The amount Qfg is obtained by integrating the FN current JFN flowing into the floating gate as:

$$Qfg = \int JFN \, dt. \quad (2)$$

The FN current JFN is given by:

$$JFN = A \, Eox2 \, exp[-B/Eox], \quad (3)$$

where Eox represents an electric field applied to the tunnel film. Coefficients A and B are determined with reference to the Ig-Vg characteristic of the MOS device in a portion where the gate voltage (Vg) is high. The programming operation is carried out by the FN current flowing from the substrate to the floating gate while the erasing operation is carried out by the FN current flowing from the floating gate to the substrate. By calculating Equations (1) through (3), simulation of the programming and the erasing operations of the EEPROM is carried out.

Figure 9:
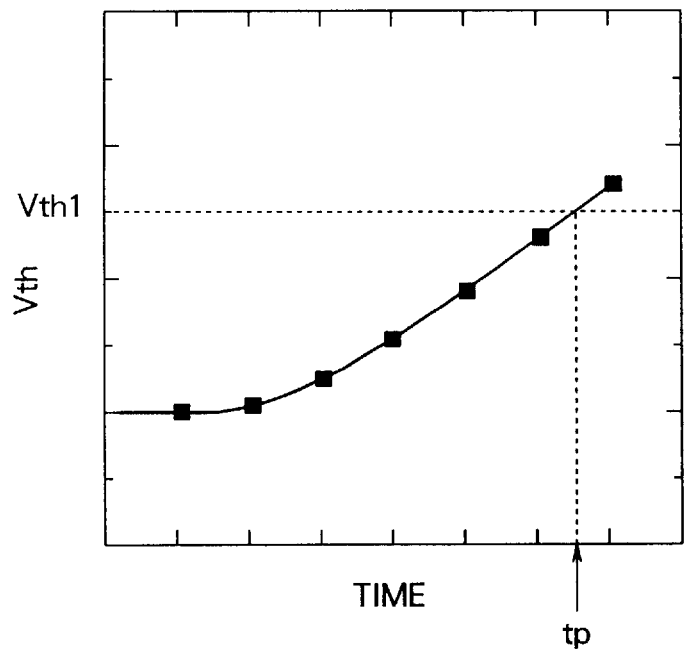
FIG. 9 shows a programming characteristic of the EEPROM which is obtained by simulation of this invention.
Figure 10:
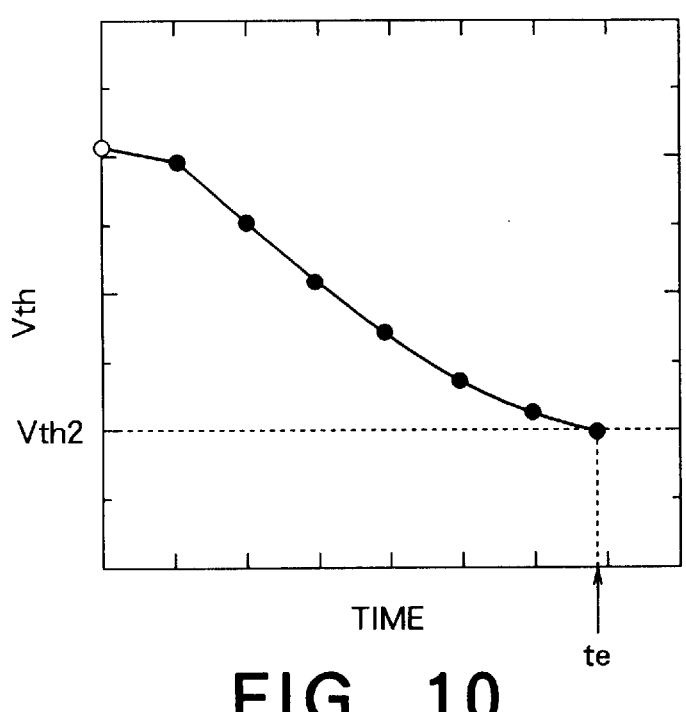
FIG. 10 shows an erasing characteristic of the EEPROM which is obtained by the simulation of this invention.

When the programming and the erasing operations are actually carried out in the EEPROM, a programming time ($t_p$) and an erase time ($t_e$) are preliminarily determined. The operating conditions are determined so as to obtain the intended threshold voltages within such time frames preliminarily determined. A programming characteristic obtained by simulation of the operation of the EEPROM is shown in FIG. 9 (wherein the abscissa is logarithmically scaled) as the relationship between the programming time and the variation of the threshold voltage ($V{th}_1$) during the programming operation. Likewise, an erasing characteristic obtained by the simulation is shown in FIG. 10 (wherein abscissa is logarithmically scaled) as the relationship between the erase time and the variation of the threshold voltage ($V{th}_2$) during the erasing operation. The programming time ($t_p$) and the erase time ($t_e$) are selected to be values depicted by arrows in the FIGS. 9 and 10, respectively. The operating conditions preliminarily determined are unchanged after repeated cycling of the programming and the erasing operations.

In the EEPROM carrying out the FN programming and the FN erasing operations, the reliability of the tunnel film is deteriorated by charge trap levels produced in the tunnel film and by the charges trapped in the charge trap levels. The charge trap levels are produced by electrons injected into the tunnel film under the FN tunneling effect. More specifically, the charges trapped in the tunnel film will shift a flat band and vary the electric field in the tunnel film. As a result, even if the same voltage is applied to the control gate, the FN current (JFN) varies before and after the cycling operations. Accordingly, as is obvious from Equations (1) through (3), the threshold voltage varies. Herein, by the use of a charge generation model, simulation is carried out taking into account the influence of the charges trapped in the tunnel film when the FN current flows.

The charge generation model is created by the use of the result of measurement of variation of the gate voltage (Vg) required in flowing a constant FN current in the above-mentioned Vg-t characteristic. A decrease of the absolute value of the gate voltage (Vg) corresponds to an increase of positive charges in the tunnel film. On the contrary, an increase of the absolute value of the gate voltage (Vg) corresponds to an increase of negative charges in the tunnel film. As illustrated in FIG. 3, in the range of a smaller injection amount of electrons, the gate voltage (Vg) is temporarily exponentially reduced and thereafter increased in substantial proportion to the injection amount. This shows that the positive holes are saturated when the injection amount is increased and that the negative charges in the tunnel film is increased in proportion to the injection amount. From the above, as for the electrons, use is made of a trap generation model such that new trap levels are produced by the injected electrons and the electrons are trapped in the new trap levels. As for the positive holes, use is made of a trap filling model such that the positive holes are trapped in the existing trap levels originally present in the oxide tunnel film before application of the electric stress. The amounts of the electrons (Ne) and the positive holes (Nh) trapped in the tunnel film are given by the following equations as functions of the injection amount (Qinj):

$$Ne = qG[Qinj - \{1 - exp(-\sigma e \, Qinj)\}/\sigma e], \quad (4)$$

and $$Nh = Nh_0 \{1 - exp(-\sigma h \, \alpha \, Qinj)\}, \quad (5)$$

where q represents the unit charge, G, the level generation rate by the injected electrons, $\sigma e$, the electron trap cross-section, $\sigma h$, the positive hole trap cross-section, $Nh_0$, the density of positive hole trap levels originally present in the tunnel film. The injection amount (Qinj) is calculated from the level of the FN current during the programming or the erasing operation.

These parameters are obtained so that the result of simulating the variation of the gate voltage (Vg) with time by the use of these parameters coincides with an experimental result. In the simulation of the operation of the EEPROM which will hereafter be described, these parameters are used also. An electric field (Eox') in presence of the trapped charges is given by:

$$Eox'=(Vfg-Vfb-Ne\cdot xe/\in +Nh\cdot xh/\in)/Dox, \qquad (6)$$

where Vfg represents a floating gate potential, Vfb, the flat-band shift by the trapped charges, xe, the distance between the electron trap levels and an injection-side interface from which the electrons are injected by the FN current, xh, the distance between the positive hole trap levels and the injection-side interface, $\in$, the dielectric constant of $SiO_2$, and Dox, the thickness of the tunnel oxide film. The floating gate potential (Vfg) is given by:

$$Vfg=\gamma Vcg+(\gamma/Ccg)\times Qfg \qquad (7)$$

and $$\gamma=Ccg/(Ccg+Cox),$$

where Cox represents the capacitance of the tunnel film.

When the electric field (Eox') thus obtained is used in calculation of the FN current (JFN) in Equation (3), simulation is carried out of the characteristics after the tunnel film is deteriorated. Taking into account the flat-band shift due to the trapped charges in the tunnel film, the threshold voltage is calculated as:

$$Vth=Vth_0-Qfg/Ccg+Vfb. \qquad (8)$$

Figure 11:
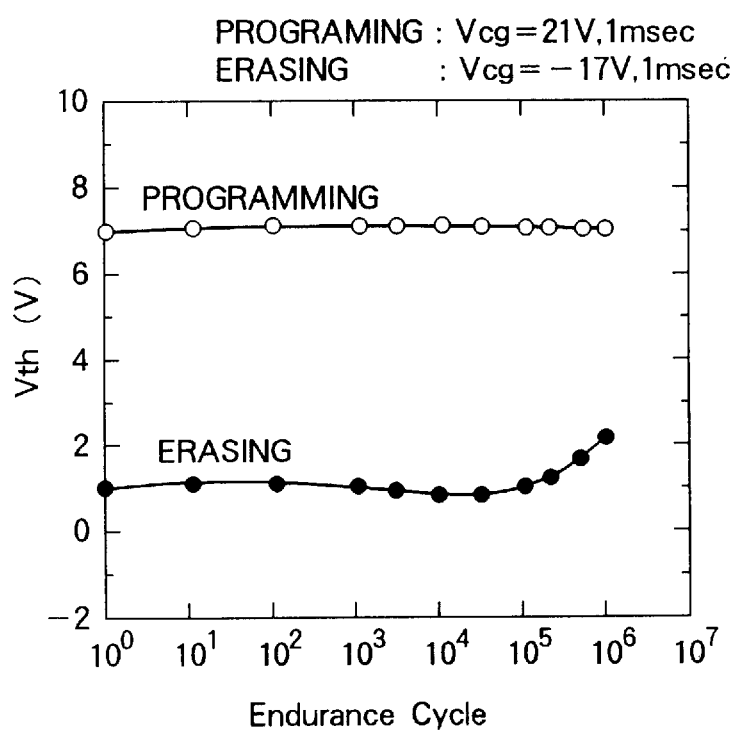
FIG. 11 shows an endurance cycle characteristic of the EEPROM which is obtained by the simulation according to an embodiment of this invention.

FIG. 11 shows the result of simulating the endurance cycle characteristic for the FN programming and the FN erasing operations by the use of the above-mentioned procedure. In FIG. 11, the abscissa is logarithmically scaled. The operating conditions in this simulation are as follows:

Control gate voltage during programming (Vp): 21V

Programming time(tp): 1msec

Control gate voltage during erasing (Ve): −17V

Erase time (te): 1msec

Like the typical experimental result (FIG. 11), the difference between the threshold voltages is reduced after experiencing the cycle times of about 100,000. The simulation of the endurance cycle characteristic described here is not restricted to the operating conditions described above but can be performed in any other conditions.

Figure 12:
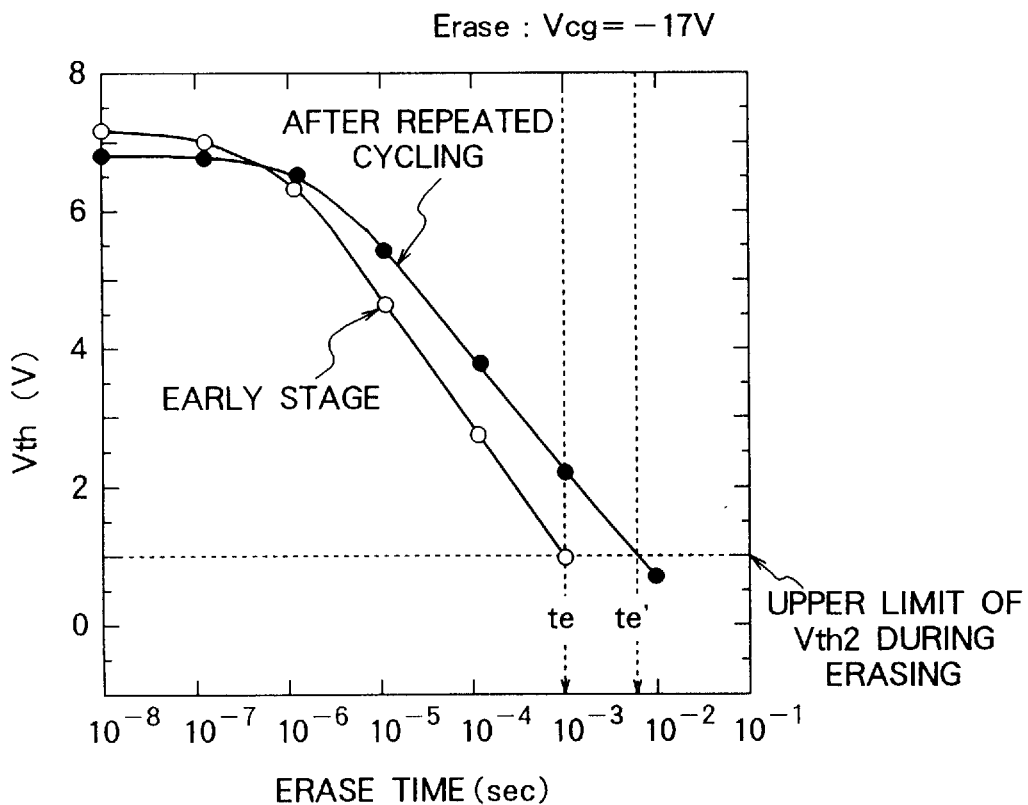
FIG. 12 is a view for describing a method of determining an erase time among operating conditions for the EEPROM according to the embodiment of this invention.

Next, description will be made about the determination of the operating conditions to assure the life up to 1,000,000 cycle times. FIG. 12 shows the result of calculation of variation of the threshold level Vth with time during the erasing operation. In FIG. 12, the abscissa is logarithmically scaled. In the figure, white circles and black circles represent the variation before repeated cycling (early stage) and the variation after cycling of 1,000,000 times. In this event, the threshold voltage after cycling of 1,000,000 times is not lowered to the initial level within the preselected erase time (te). This means that a longer erase time is required. If the erase time can be controlled, the preselected erase time (te) is modified into a modified erase time (te'). Thus, the intended threshold voltage can be obtained even after repeated cycling. Alternatively, the erase time may be extended from the preselected value (te) to the modified value (te') with the increase of the cycle times in order to obtain the threshold voltage equal to the initial threshold voltage even after repeated cycling. In the example described here, it is understood that the threshold voltage equal to the initial threshold voltage can be obtained if the erase time is modified from an initial preselected value of 1msec into a greater value of 5msec after cycling of 1,000,000 times. In case where the erase time can not be controlled, the gate voltage applied to the control gate may be increased with the increase of the cycle times in order to achieve the intended threshold voltage. Such increase of the gate voltage applied to the control gate can also be predicted by the use of the above-mentioned simulation, for example, by calculating the threshold voltage (Vth) as a function of the control voltage.

The simulation of the operation of the EEPROM according to this embodiment requires about 15 minutes in order to obtain the endurance cycle characteristic in FIG. 11 in an engineering workstation.

EXAMPLE 2

Description will be made as regards the prediction of the retention characteristic for evaluation of the reliability in conjunction with the EEPROM similar to that used in Example 1.

The deterioration of the retention characteristic is indicated by the decrease of the threshold voltage during the programming operation due to a so-called leakage current. Specifically, the leakage current is caused when the electrons accumulated in the floating gate leak from the electrode for some reason. In this connection, the retention characteristic can be evaluated by the amount of charges accumulated in the floating gate, in other words, the variation of the floating gate voltage (Vfg) with time. The floating gate voltage (Vfg) at a particular time instant (t=t1) is calculated by:

$$Vfg = \left( Qfg_0 - \int_0^{t1} Jleak\, dt \right) Ccg, \qquad (9)$$

where $Qfg_0$ represents the amount of charges accumulated in the floating gate immediately after programming (t=0), Jleak, the leakage current level.

Figure 13:
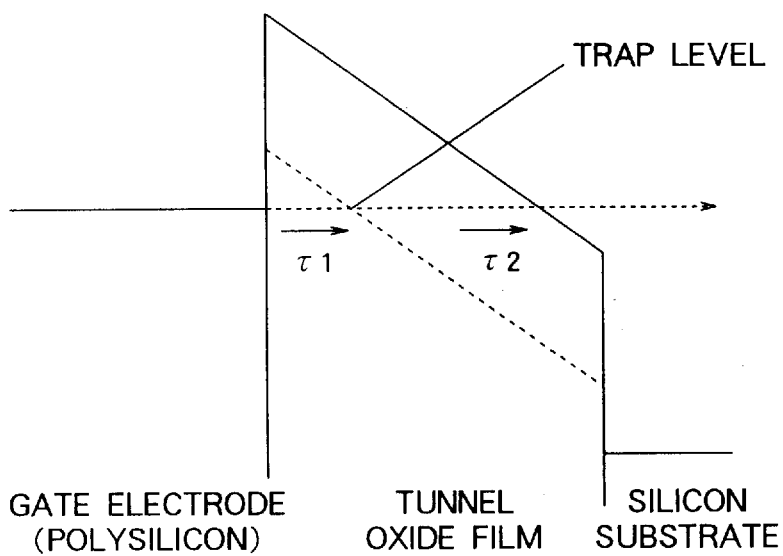
FIG. 13 is a schematic diagram showing a leakage current through a charge trap level in an oxide film.

It is known that the deterioration of the retention characteristic of the EEPROM carrying out the FN programming and the FN erasing operations results from the leakage current. The leakage current is caused by the electrons tunneling (see FIG. 13) through the electron trap levels generated in the oxide film when the FN current flows therethrough. The leakage current Jleak is given by:

$$Jleak=qNox/(\tau_1+\tau_2), \qquad (10)$$

where Nox represents the density of the electron trap levels in the tunnel film, $\tau_1$, the time constant of tunneling from the floating gate to the trap levels in the tunnel film, $\tau_2$, the time constant of tunneling from the trap levels in the tunnel film to the substrate.

The time constants $\tau_1$ and $\tau_2$ are calculated from the probability of tunneling to each level and given as a function of the trap cross-section and the electric field in the tunnel film. The density Nox, the trap cross-section, and the electric field in the tunnel film are calculated by the use of the trap model described in conjunction with Example 1. The leakage current (Jleak) calculated by Equation (10) is substituted into Equation (9). Thus, the retention characteristic is simulated.

Figure 14:
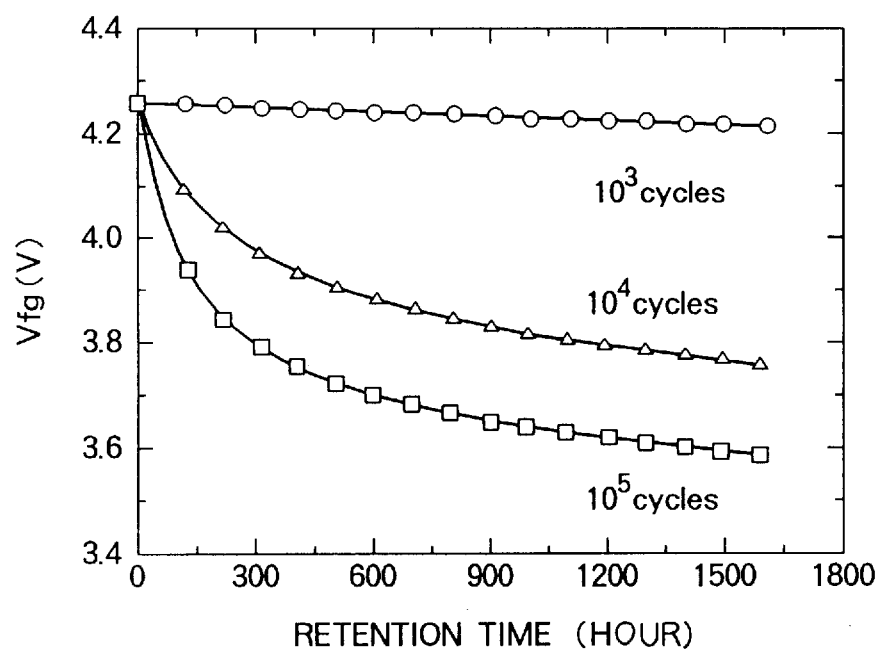
FIG. 14 shows a retention characteristic of the EEPROM which is obtained by the simulation according to the embodiment of this invention.

FIG. 14 shows the result of simulating the retention characteristic for each of different cycle times of the FN programming and the FN erasing operations. The operating conditions are as follows:

Control gate voltage during programming (Vp): 24V

Programming time (tp): 1msec

Control gate voltage during erasing (Ve): −17V

Erase time (te): 1msec

In the EEPROM as an object of this simulation, the operating conditions are fixed to these values. It is assumed here that the allowance of decrease of the floating gate voltage corresponding to the allowable range of variation of the threshold voltage is equal to 2V. In this event, it is predicted that the retention characteristic satisfying the intended life can not be obtained in the above-mentioned operating conditions. Under the circumstances, interruption of the manufacture at this stage is decided. According to this invention, it is possible to decide the interruption of the manufacture at a relatively early stage in the manufacturing process of the EEPROM, namely, when the MOSFET has been manufactured. Therefore, the number of steps and the cost can be considerably reduced as compared with the prior art technique in which the decision of the reliability is made after the EEPROM is completely manufactured.

Figure 15:
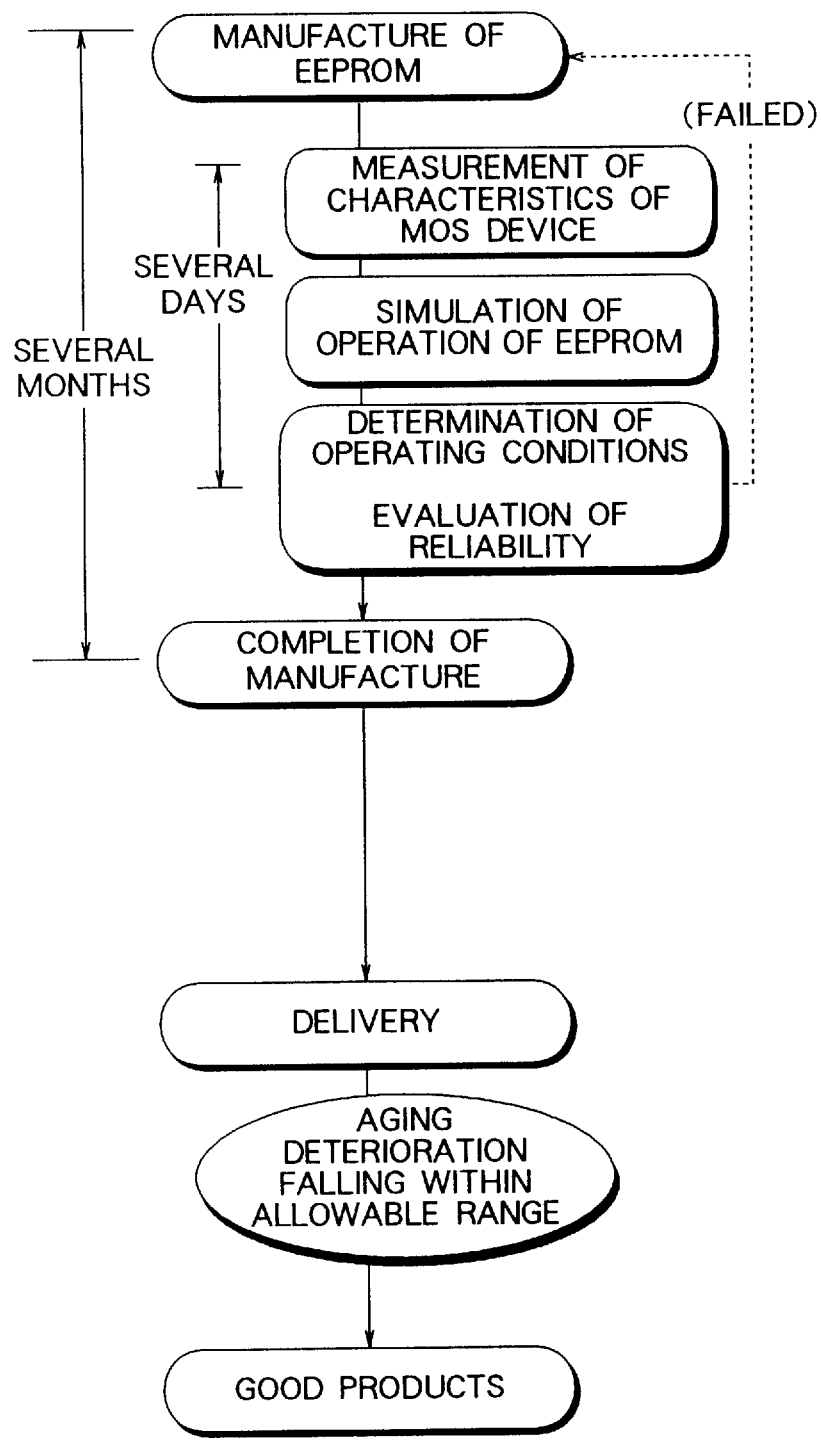
FIG. 15 is a flow chart for describing a method of determining the operating conditions according to this invention.
Figure 16:
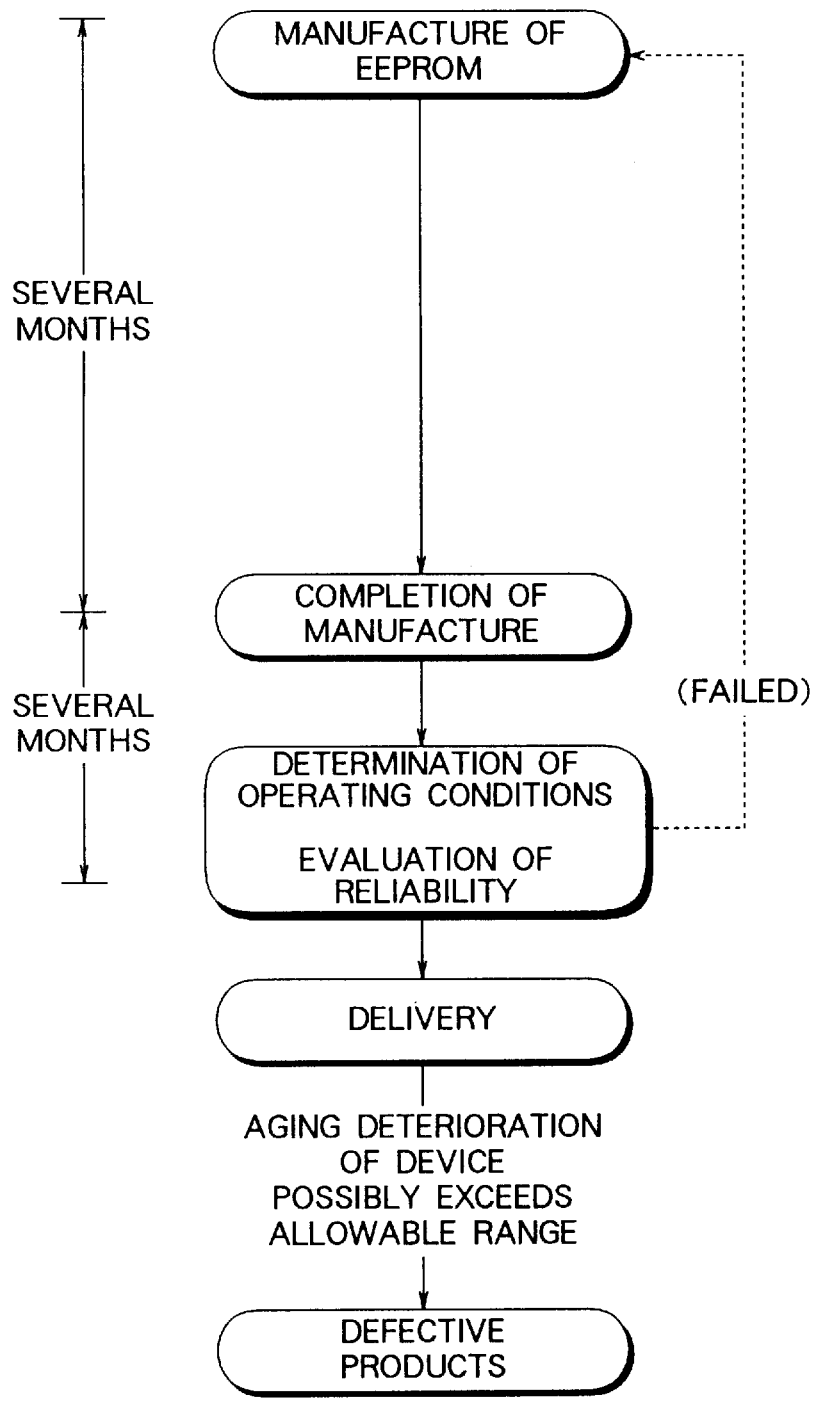
FIG. 16 is a flow chart for describing a conventional method.

Referring to FIG. 15, the basic process of this invention will be summarized. At first, the MOS device is prepared in the condition equivalent to that of the MOSFET which is one of the components of the EEPROM in consideration. The characteristics of the MOS device are measured. By the use of the parameters extracted from the result of measurement, the operation of the EEPROM is simulated. As a result of simulation, the endurance cycle characteristic is obtained as a function of the controllable conditions. With reference to the endurance cycle characteristic, the optimum operating conditions to achieve the intended characteristics after repeated cycling are obtained. It is possible, during manufacture of the EEPROM, to design a circuit satisfying the optimum operating conditions obtained by the simulation. If the life and the operating conditions predicted and determined by the simulation do not meet the requirement for the circuitry, interruption of manufacture at this stage is decided. Otherwise, the manufacture is continued. The actual EEPROMs are operated under the operating conditions thus determined. Those products suffering early failures are eliminated by the known technique illustrated in FIG. 16. The remaining products are assured to have the characteristics, including the life, of the intended values or within the intended allowable ranges.

As described above, according to this invention, the life of the nonvolatile semiconductor memory (for example, EEPROM) is predicted without manufacturing the actual products of the nonvolatile semiconductor memory (EEPROM). The operating conditions are determined so as to satisfy the intended life required as a result of prediction. Thus, it is possible to provide the products assured to be reliable. Furthermore, according to this invention, judgement is made of the validity of the manufacturing process of the nonvolatile semiconductor memory (EEPROM) in an early stage of the manufacturing process. The operating conditions for the accepted lot can be determined at this stage. Accordingly, this invention is effective in saving the number of steps.

What is claimed is:

1. A method of determining operating conditions for a nonvolatile semiconductor memory, comprising:

partially manufacturing said memory, said partially manufactured memory including a MOSFET;

simulating operation of said partially manufactured memory based on at least one parameter of said MOSFET;

determining a life of said partially manufactured memory based on a result of said simulating step; and determining at least one operating condition for said partially manufactured memory that will cause said partially manufactured memory, once manufactured, to operate for a duration which includes the life determined in said life determining step.

2. A method as claimed in claim 1, wherein said nonvolatile semiconductor memory is an EEPROM (Electrically Erasable Programmable Read-Only Memory).

3. A method as claimed in claim 1, wherein said simulating step includes simulating the operation of said nonvolatile semiconductor memory after completion of manufacture of said MOSFET to obtain said simulation result.

4. A method as claimed in claim 3, wherein said nonvolatile semiconductor memory is an EEPROM (Electrically Erasable Programmable Read-Only Memory).

5. A method as claimed in claim 3, wherein said simulating step comprises:

a step of obtaining, from measurement of characteristics of said MOSFET, parameters used in simulating the operation of said nonvolatile semiconductor memory before completion of manufacture of said nonvolatile semiconductor memory and after completion of manufacture of said MOSFET; and a simulation executing step of executing simulation of the operation of said nonvolatile semiconductor memory by using said parameters to obtain said simulation result.

6. A method as claimed in claim 5, wherein said nonvolatile semiconductor memory is an EEPROM (Electrically Erasable Programmable Read-Only Memory).

7. A method as claimed in claim 5, wherein:

said simulation executing step includes executing said simulation of the operation of said nonvolatile semiconductor memory by using said parameters to obtain, as said simulation result, a result relating to deterioration of operation characteristics of said nonvolatile semiconductor memory;

said second step includes obtaining the operating conditions for said nonvolatile semiconductor memory from said result relating to the deterioration of the operation characteristics of said nonvolatile semiconductor memory.

8. A method as claimed in claim 7, wherein said nonvolatile semiconductor memory is an EEPROM (Electrically Erasable Programmable Read-Only Memory).

9. A method for determining operating conditions for a non-volatile semiconductor memory, comprising:

partially manufacturing said memory, said partially manufactured memory including a MOSFET;

simulating operation of said partially manufactured memory based on at least one parameter of said MOSFET;

determining a life of said memory based on a result of said simulating step; and determining at least one operating condition for said partially manufactured memory that will cause said memory, once manufactured, to operate for a duration which includes the life determined in said determining step.

10. A method as claimed in claim 9, wherein said at least one parameter includes one of a group consisting of (1) a gate voltage versus time characteristic on constant-current stress condition, (2) a gate current versus time characteristic on constant-voltage stress condition, (3) capacitance versus gate voltage characteristic, (4) gate current versus gate voltage characteristic, (5) drain current versus drain voltage characteristic, and (6) drain current versus gate voltage characteristic.

11. A method as claimed in claim 9, further comprising:
   evaluating operation of said memory based on at least one analysis criterion; and
   predicting as the life of said memory a duration over which said memory, as simulated, exhibits operation above a predetermined degraded condition relative to said analysis criterion.

12. A method as claimed in claim 11, wherein said at least one analysis criterion includes at least one of endurance cycle characteristics and retention characteristics of said memory.

13. A method as claimed in claim 12, wherein when said analysis criterion is endurance cycle characteristics, said life is a duration which corresponds to a time when a difference between a threshold voltage for a programing operation and threshold voltage for an erasing operation falls below a predetermined difference, and
   wherein when said analysis criterion is retention characteristics, said life is a duration which corresponds to a time when variation of a threshold voltage in a programming condition falls below a predetermined value.

* * * * *